United States Patent
Shen et al.

(10) Patent No.: US 9,691,696 B2
(45) Date of Patent: Jun. 27, 2017

(54) INTERPOSERS WITH CIRCUIT MODULES ENCAPSULATED BY MOLDABLE MATERIAL IN A CAVITY, AND METHODS OF FABRICATION

(71) Applicant: Invensas Corporation, San Jose, CA (US)

(72) Inventors: Hong Shen, Palo Alto, CA (US); Liang Wang, Milpitas, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/005,220

(22) Filed: Jan. 25, 2016

(65) Prior Publication Data

US 2016/0155695 A1 Jun. 2, 2016

Related U.S. Application Data

(63) Continuation of application No. 14/558,462, filed on Dec. 2, 2014, now Pat. No. 9,324,626.

(Continued)

(51) Int. Cl.
*H01L 23/498* (2006.01)
*H01L 23/31* (2006.01)
(Continued)

(52) U.S. Cl.
CPC .... *H01L 23/49827* (2013.01); *H01L 21/2885* (2013.01); *H01L 21/56* (2013.01); *H01L 21/76879* (2013.01); *H01L 21/76897* (2013.01); *H01L 23/04* (2013.01); *H01L 23/147* (2013.01); *H01L 23/315* (2013.01); *H01L 23/3107* (2013.01); *H01L 23/3675* (2013.01);

(Continued)

(58) Field of Classification Search
USPC ......................................................... 257/686
See application file for complete search history.

(56) References Cited

U.S. PATENT DOCUMENTS 5,532,519 A 7/1996 Bertin et al.
5,701,233 A 12/1997 Carson et al.
(Continued)

FOREIGN PATENT DOCUMENTS

EP 1 418 617 A2 5/2004
EP 1 884 994 A2 2/2008
(Continued)

OTHER PUBLICATIONS

U.S. Appl. No. 14/201,585, filed Mar. 7, 2014.
(Continued)

*Primary Examiner* — Marc Armand
(74) *Attorney, Agent, or Firm* — Haynes and Boone, LLP

(57) ABSTRACT

Stacked dies (110) are encapsulated in an interposer's cavity (304) by multiple encapsulant layers (524) formed of moldable material. Conductive paths (520, 620.3) connect the dies to the cavity's bottom wall (304B) and, through TSVs passing through the bottom wall, to a conductor below the interposer. The conductive paths can be formed in segments each of which is formed in a through-hole (514) in a respective encapsulant layer. Each segment can be formed by electroplating onto a lower segment; the electroplating current can be provided from below the interposer through the TSVs and earlier formed segments. Other features are also provided.

20 Claims, 11 Drawing Sheets

Related U.S. Application Data

(60) Provisional application No. 61/952,066, filed on Mar. 12, 2014.

(51) Int. Cl.

| | | |
|---|---|---|
| *H01L 21/56* | (2006.01) | |
| *H01L 21/288* | (2006.01) | |
| *H01L 21/768* | (2006.01) | |
| *H01L 25/065* | (2006.01) | |
| *H01L 25/00* | (2006.01) | |
| *H01L 23/04* | (2006.01) | |
| *H01L 23/14* | (2006.01) | |
| *H01L 23/367* | (2006.01) | |
| *H01L 23/00* | (2006.01) | |
| *H01L 23/48* | (2006.01) | |
| *H01L 23/538* | (2006.01) | |
| *H01L 23/10* | (2006.01) | |

(52) U.S. Cl.
CPC ...... *H01L 23/481* (2013.01); *H01L 23/49838* (2013.01); *H01L 23/5389* (2013.01); *H01L 24/97* (2013.01); *H01L 25/0652* (2013.01); *H01L 25/50* (2013.01); *H01L 23/10* (2013.01); *H01L 2224/16145* (2013.01); *H01L 2224/16225* (2013.01); *H01L 2224/32225* (2013.01); *H01L 2224/73204* (2013.01); *H01L 2225/06548* (2013.01); *H01L 2225/06555* (2013.01); *H01L 2924/12042* (2013.01); *H01L 2924/15311* (2013.01); *H01L 2924/181* (2013.01)

(56) References Cited

U.S. PATENT DOCUMENTS

| | | |
|---|---|---|
| 6,157,076 A | 12/2000 | Azotea et al. |
| 6,222,722 B1 | 4/2001 | Fukuzumi et al. |
| 6,251,796 B1 | 6/2001 | Abdul-Ridha et al. |
| 6,322,903 B1 | 11/2001 | Siniaguine et al. |
| 6,384,473 B1 | 5/2002 | Peterson et al. |
| 6,403,444 B2 | 6/2002 | Fukuzumi et al. |
| 6,451,650 B1 | 9/2002 | Lou |
| 6,492,726 B1 | 12/2002 | Quek et al. |
| 6,613,672 B1 | 9/2003 | Wang et al. |
| 6,620,701 B2 | 9/2003 | Ning |
| 6,624,505 B2 | 9/2003 | Badehi |
| 6,717,254 B2 | 4/2004 | Siniaguine |
| 6,746,876 B2 | 6/2004 | Itoh et al. |
| 6,787,916 B2 | 9/2004 | Halahan |
| 6,947,275 B1 | 9/2005 | Anderson et al. |
| 6,958,285 B2 | 10/2005 | Siniaguine |
| 7,011,988 B2 | 3/2006 | Forcier |
| 7,049,170 B2 | 5/2006 | Savastiouk et al. |
| 7,061,102 B2 | 6/2006 | Eghan et al. |
| 7,115,988 B1 | 10/2006 | Hool |
| 7,144,745 B2 | 12/2006 | Badehi |
| 7,183,643 B2 | 2/2007 | Gibson et al. |
| 7,400,036 B2 | 7/2008 | Tan |
| 7,670,921 B2 | 3/2010 | Chinthakindi et al. |
| 7,863,096 B2 | 1/2011 | England |
| 7,906,803 B2 | 3/2011 | Shioya et al. |
| 7,928,548 B2 | 4/2011 | Bernstein et al. |
| 7,977,579 B2 | 7/2011 | Bathan et al. |
| 7,989,270 B2 | 8/2011 | Huang et al. |
| 8,018,068 B1 | 9/2011 | Scanlan |
| 8,071,470 B2 | 12/2011 | Khor et al. |
| 8,072,082 B2 | 12/2011 | Yean et al. |
| 8,076,788 B2 | 12/2011 | Haba et al. |
| 8,102,039 B2 | 1/2012 | Noma et al. |
| 8,110,862 B2 | 2/2012 | Cheng et al. |
| 8,183,696 B2 | 5/2012 | Meyer |
| 8,257,985 B2 | 9/2012 | Stevenson |
| 8,377,829 B2 | 2/2013 | Yeh et al. |
| 8,378,480 B2 | 2/2013 | Chen et al. |
| 8,397,013 B1 | 3/2013 | Rosenband et al. |
| 8,426,961 B2 | 4/2013 | Shih et al. |
| 8,470,668 B2 | 6/2013 | Cho et al. |
| 8,518,753 B2 | 8/2013 | Wu et al. |
| 8,519,537 B2 | 8/2013 | Jeng et al. |
| 8,525,318 B1 | 9/2013 | Kim |
| 8,575,493 B1 | 11/2013 | Xu et al. |
| 8,598,695 B2 | 12/2013 | Oganesian et al. |
| 8,629,546 B1 | 1/2014 | Scanlan |
| 8,674,423 B2 | 3/2014 | Collins et al. |
| 9,165,793 B1 | 10/2015 | Wang |
| 2004/0174682 A1 | 9/2004 | Lin |
| 2004/0178495 A1 | 9/2004 | Yean |
| 2004/0183187 A1 | 9/2004 | Yamasaki et al. |
| 2004/0201111 A1 | 10/2004 | Thurgood |
| 2005/0046002 A1 | 3/2005 | Lee |
| 2005/0047094 A1 | 3/2005 | Hsu et al. |
| 2005/0196095 A1 | 9/2005 | Karashima et al. |
| 2005/0263869 A1 | 12/2005 | Tanaka et al. |
| 2005/0266701 A1 | 12/2005 | Aoyagi |
| 2007/0029654 A1 | 2/2007 | Sunohara et al. |
| 2007/0045798 A1 | 3/2007 | Horie et al. |
| 2007/0235850 A1 | 10/2007 | Gerber et al. |
| 2008/0128897 A1 | 6/2008 | Chao |
| 2008/0244902 A1 | 10/2008 | Blackwell et al. |
| 2008/0280394 A1 | 11/2008 | Murtuza |
| 2009/0008762 A1 | 1/2009 | Jung |
| 2009/0115047 A1 | 5/2009 | Haba et al. |
| 2009/0267238 A1 | 10/2009 | Joseph et al. |
| 2010/0025081 A1 | 2/2010 | Arai et al. |
| 2010/0084761 A1 | 4/2010 | Shinagawa |
| 2010/0134991 A1 | 6/2010 | Kim |
| 2010/0144101 A1 | 6/2010 | Chow |
| 2010/0224980 A1 | 9/2010 | Chahal et al. |
| 2010/0230797 A1 | 9/2010 | Honda |
| 2010/0230806 A1 | 9/2010 | Huang et al. |
| 2010/0276799 A1 | 11/2010 | Heng et al. |
| 2011/0027967 A1 | 2/2011 | Beyne et al. |
| 2011/0068468 A1 | 3/2011 | Lin |
| 2011/0101349 A1 | 5/2011 | Oda |
| 2011/0221072 A1 | 9/2011 | Chin |
| 2011/0287606 A1 | 11/2011 | Brun et al. |
| 2012/0061852 A1 | 3/2012 | Su et al. |
| 2012/0086135 A1 | 4/2012 | Thompson et al. |
| 2012/0091583 A1 | 4/2012 | Kawashita et al. |
| 2012/0101540 A1 | 4/2012 | O'Brien et al. |
| 2012/0106228 A1 | 5/2012 | Lee |
| 2012/0228778 A1 | 9/2012 | Kosenko et al. |
| 2012/0276733 A1 | 11/2012 | Saeki et al. |
| 2012/0295415 A1 | 11/2012 | Ono |
| 2012/0319300 A1 | 12/2012 | Kim et al. |
| 2013/0010441 A1 | 1/2013 | Oganesian et al. |
| 2013/0014978 A1 | 1/2013 | Uzoh et al. |
| 2013/0082383 A1 | 4/2013 | Aoya |
| 2013/0082399 A1 | 4/2013 | Kim et al. |
| 2013/0087917 A1 | 4/2013 | Jee et al. |
| 2013/0093075 A1 | 4/2013 | Liu et al. |
| 2013/0099368 A1 | 4/2013 | Han |
| 2013/0119527 A1 | 5/2013 | Luo et al. |
| 2013/0119528 A1 | 5/2013 | Groothuis et al. |
| 2013/0146991 A1 | 6/2013 | Otremba et al. |
| 2013/0181354 A1 | 7/2013 | Khan et al. |
| 2013/0228898 A1 | 9/2013 | Ide |
| 2013/0241026 A1 | 9/2013 | Or-Bach et al. |
| 2013/0267046 A1 | 10/2013 | Or-Bach et al. |
| 2013/0270660 A1 | 10/2013 | Bryzek et al. |
| 2013/0292840 A1 | 11/2013 | Shoemaker et al. |
| 2013/0313680 A1 | 11/2013 | Oganesian et al. |
| 2014/0036454 A1 | 2/2014 | Caskey et al. |
| 2014/0070380 A1 | 3/2014 | Chiu et al. |
| 2015/0262902 A1 | 9/2015 | Shen |
| 2015/0262972 A1 | 9/2015 | Katkar |

FOREIGN PATENT DOCUMENTS

| | | |
|---|---|---|
| EP | 1688994 B1 | 8/2008 |
| EP | 2546876 A1 | 1/2013 |
| EP | 2 555 239 A2 | 2/2013 |

(56) References Cited

FOREIGN PATENT DOCUMENTS

| WO | WO 2005/022630 A1 | 3/2005 |
|---|---|---|
| WO | WO 2006/124597 A2 | 11/2006 |
| WO | WO 2007/142721 A1 | 12/2007 |
| WO | WO 2009/070348 A1 | 6/2009 |
| WO | WO 2012/169162 A1 | 12/2012 |
| WO | WO 2013/062533 A1 | 5/2013 |

OTHER PUBLICATIONS

U.S. Appl. No. 14/214,365, filed Mar. 14, 2014.
Hybrid Memory Cube Consortium, "Hybrid Memory Cube Specification 1.0," Last Revision Jan. 2013, 122 pages, Retrieved from: http://hybridmemorycube.org/specification-download/.
ChipScale Review, "The Impact of CSPs on Encapsulation Materials," ChipScale Review publication issue Mar. 1998, retrieved Feb. 21, 2014, 6 pages.
Dr. Paul A. Magill, "A New Thermal-Management Paradigm for Power Devices," Power Electronics Technology, Nov. 2008, pp. 26-30.
Herming Chiueh et al., "A Dynamic Thermal Management Circuit for System-On-Chip Designs," Analog Integrated Circuits and Signal Processing, 36, pp. 175-181, Jan. 25, 2003.
K. Zoschke et al., "Hermetic Wafer Level Packaging of MEMS Components Using Through Silicon Via and Wafer to Wafer Bonding Technologies" (2013 Electronic Components & Technology Conference, IEEE, pp. 1500-1507).
Lau et al., "Thin-Wafer Handling with a Heat-Spreader Wafer for 2.5D/3D IC Integration," 46$^{th}$ International Symposium on Microelectronics (IMAPS 2013) Sep. 30-Oct 3, 2013, Orlando, FL USA, pp. 1-8 [389-396].
Li Shang et al., "Thermal Crisis: Challenges and Potential Solutions," Potentials, vol. 25, Issue 5, Sep./Oct. 2006, pp. 31-35.
Nakamura et al., "Technology Trends and Future History of Semiconductor Packaging Substrate Material," Hitachi Chemical Review Technical Report No. 55, May 2013, pp. 24-29.
Pulliam, Wayne, "Designing with BGAs," AMD presentation, 2008, 62 pages.
San Hwui Lee et al., "Wafer-to-Wafer Alignment for Three Dimensional Integration: A Review," Journal of Microelectromechanical Systems, vol. 20, Issue 4, Aug. 2011, pp. 885-898.
Dreiza; Moody et al., "Joint Project for Mechanical Qualification of Next Generation High Density Package-on-Package (PoP) with Through Mold Via Technology," Amkor Technology, EMPC2009—17th European Microelectronics & Packaging Conference, Jun. 16, Rimini, Italy, 8 pages.
Zwenger; Curtis et al., "Next Generation Package-on_Package (PoP) Platform with Through Mold Via (TMV™) Interconnection Technology," Amkor Technology, Originally published in the proceedings of the IMPAS Device Packaging Conference, Scottsdale, AZ, Mar. 10-12, 2009, 8 pages.
Kim; Jinseong et al., "Application of Through Mold Via (TMV) as PoP base package," Amkor Technology, 2008 IEEE Reprinted from ECTC2008 Proceedings, 6 pages.
U.S. Appl. No. 14/250,317 titled "Die Stacks With One or More Bond Via Arrays," filed Apr. 10, 2014, 58 pages.
Das; Rabindra N. et al., "Package-Interpose-Package (PIP) Technology for High End Electronics," Endicott Interconnect Technologies, Inc., retrieved Jul. 31, 2014, 4 pages.
McCormick; Heather et al., "Assembly and Reliability Assessment of Fine Pitch TMV Package on Package (PoP) Components," Amkor Technology Inc., Originally published in the Proceedings of the SMTA International Conference, San Diego, CA, Oct. 4-8, 2009, 8 pages.
U.S. Appl. No. 14/288,064 titled, "Integrated Circuit Assemblies With Reinforcement Frames, and Methods of Manufacture," filed May 27, 2014.
U.S. Appl. No. 14/268,899 titled, "Making Electrical Components in Handle Wafers of Integrated Circuit Packages," filed May 2, 2014.
K.T. Turner et al., "Mechanics of direct wafer bonding", Proc. R. Soc. A, 462, 171-188, Nov. 9, 2005.
Pre-Interview First Office Action dated Oct. 22, 2014 of U.S. Appl. No. 14/214,365.
U.S. Appl. No. 14/328,380 titled, "Microelectronic Assemblies With Integrated Circuits and Interposers With Cavities, and Methods of Manufacture," filed Jul. 10, 2014.
A. Strandjord et al., "Bumping for WLCSP using Solder Ball Attach on electrolessss NiAu UBM", Pac Tech USA—Packaging Technologies, Inc., 29 pages, 2008.
M.A. Boyle et al., "Epoxy Resins", Composites, vol. 21, ASM Handbook, ASM International, p. 78-89, 2001.
Final Office Action dated Mar. 2, 2015 of U.S. Appl. No. 14/214,365.
Notice of Allowance dated Apr. 16, 2015 of U.S. Appl. No. 14/268,899.
International Search Report and Written Opinion for PCT/US2015/019609 dated May 12, 2015, 11 pages.
International Search Report and Written Opinion, Aug. 6, 2015, 10 pages, PCT Patent Application No. PCT/US2015/028172.
International Search Report and Written Opinion in PCT/US2015/063128, issued Feb. 18, 2016.

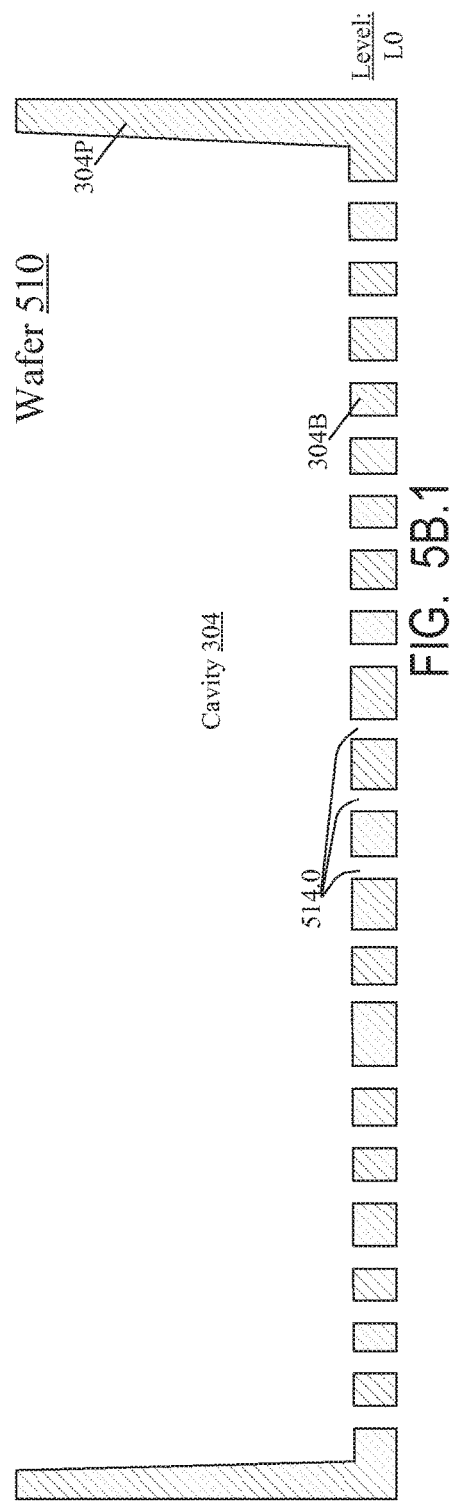
FIG. 5B.1
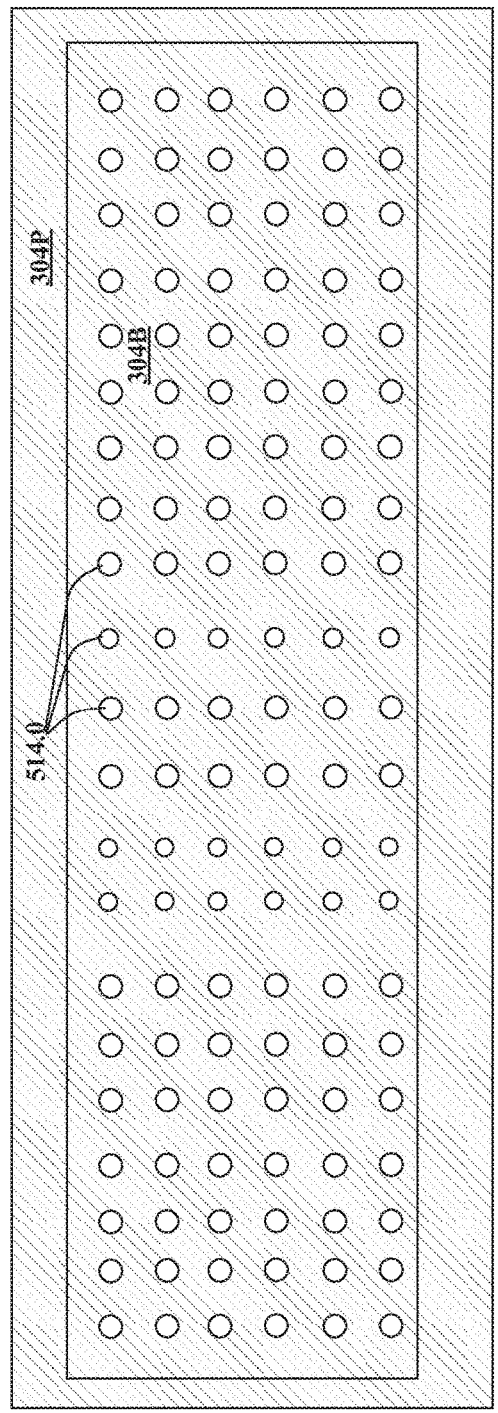
FIG. 5B.2

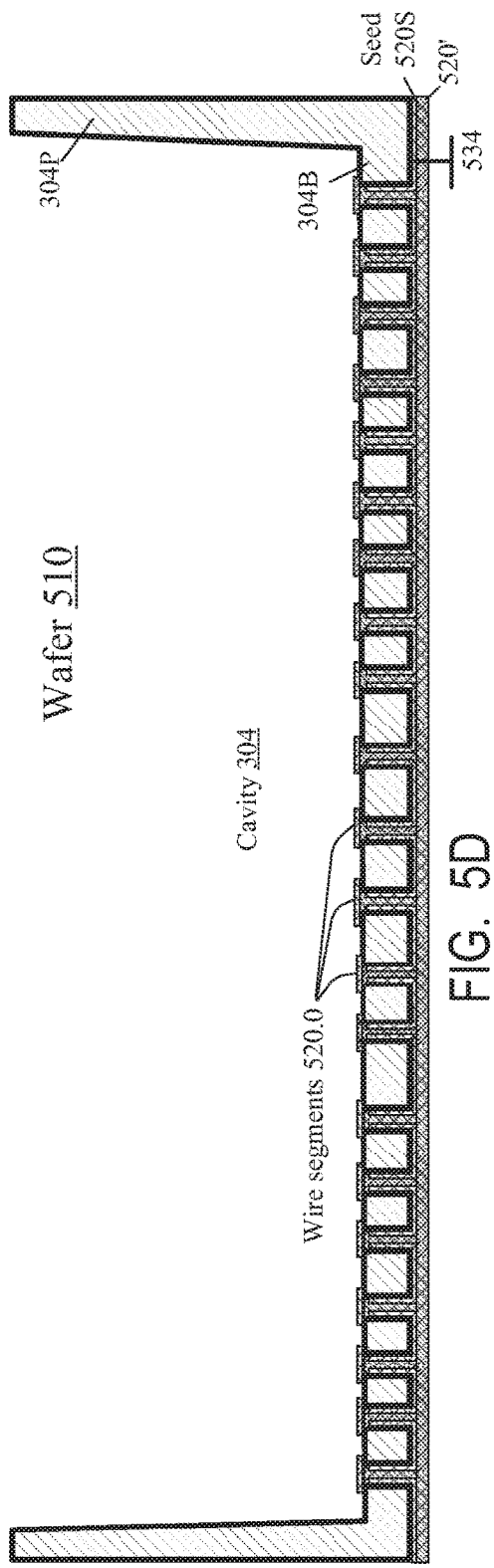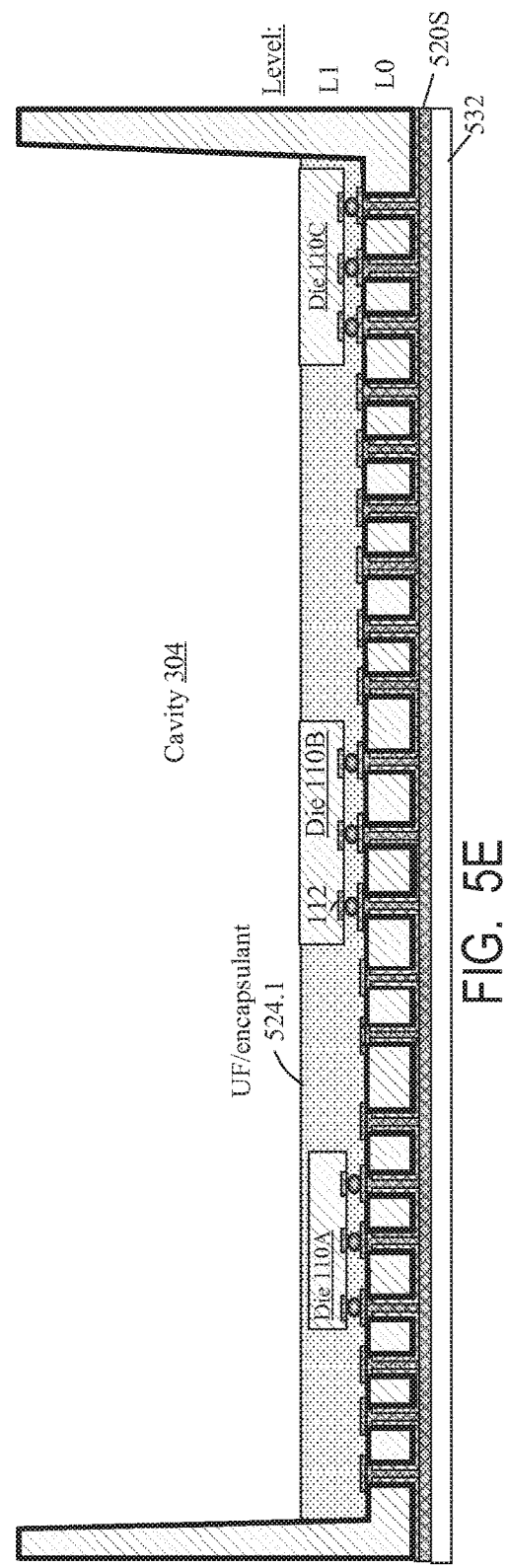

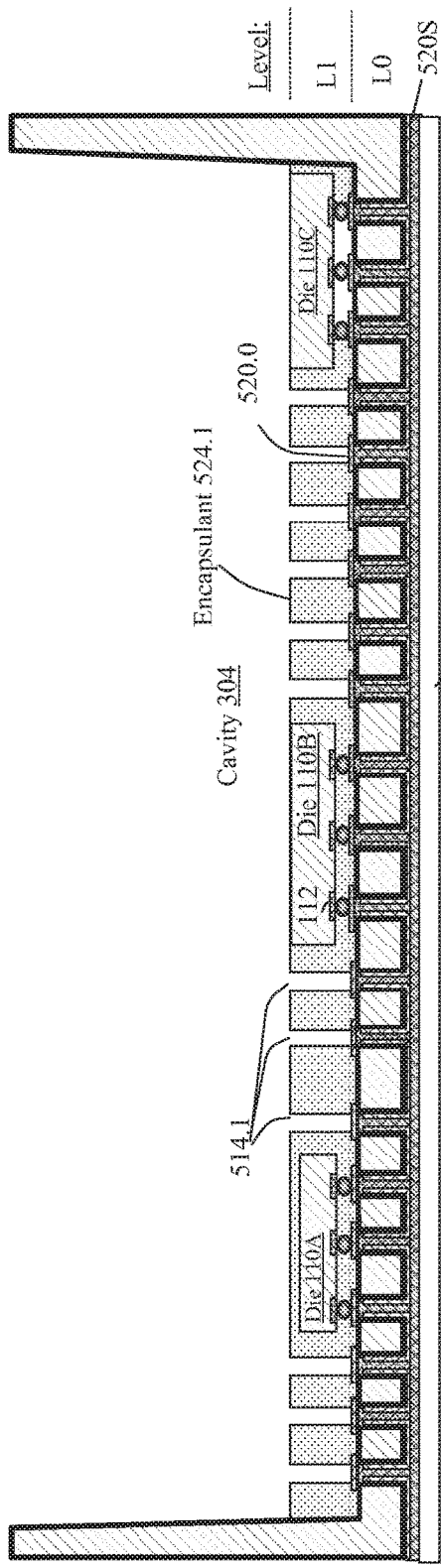
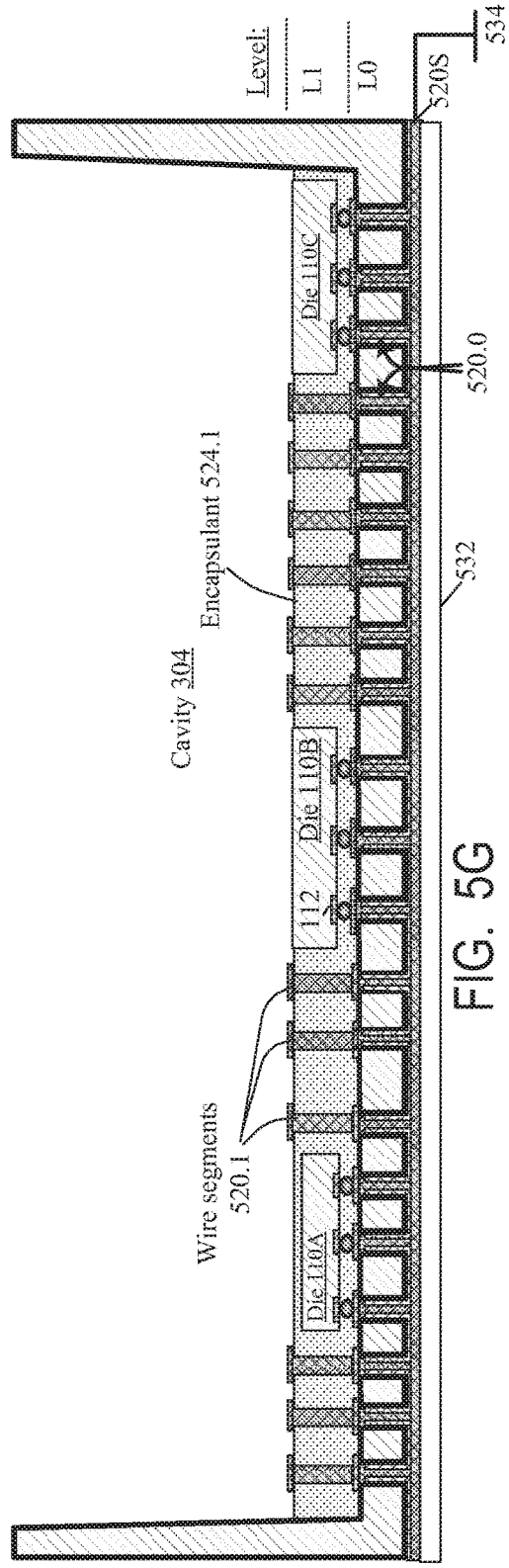

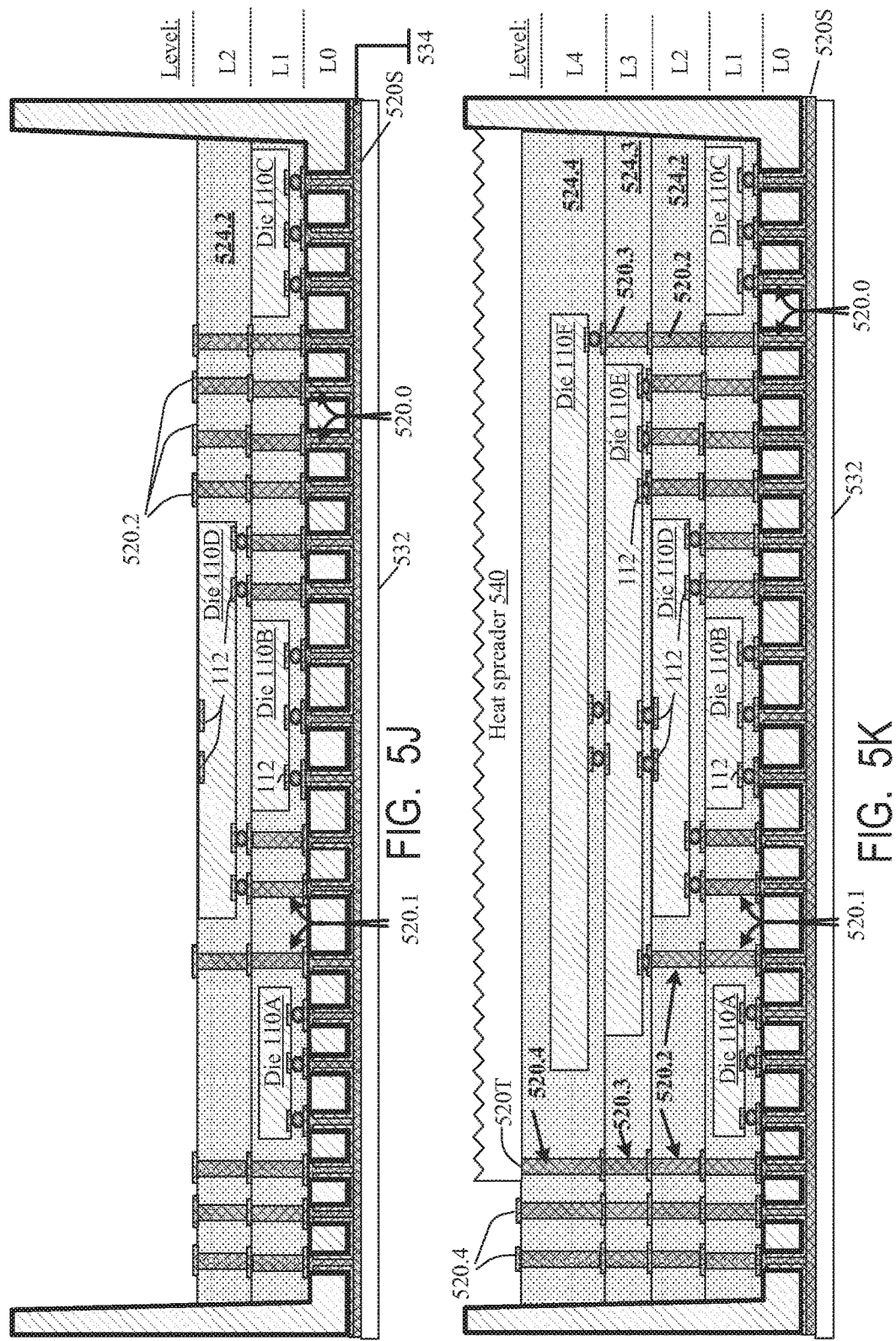

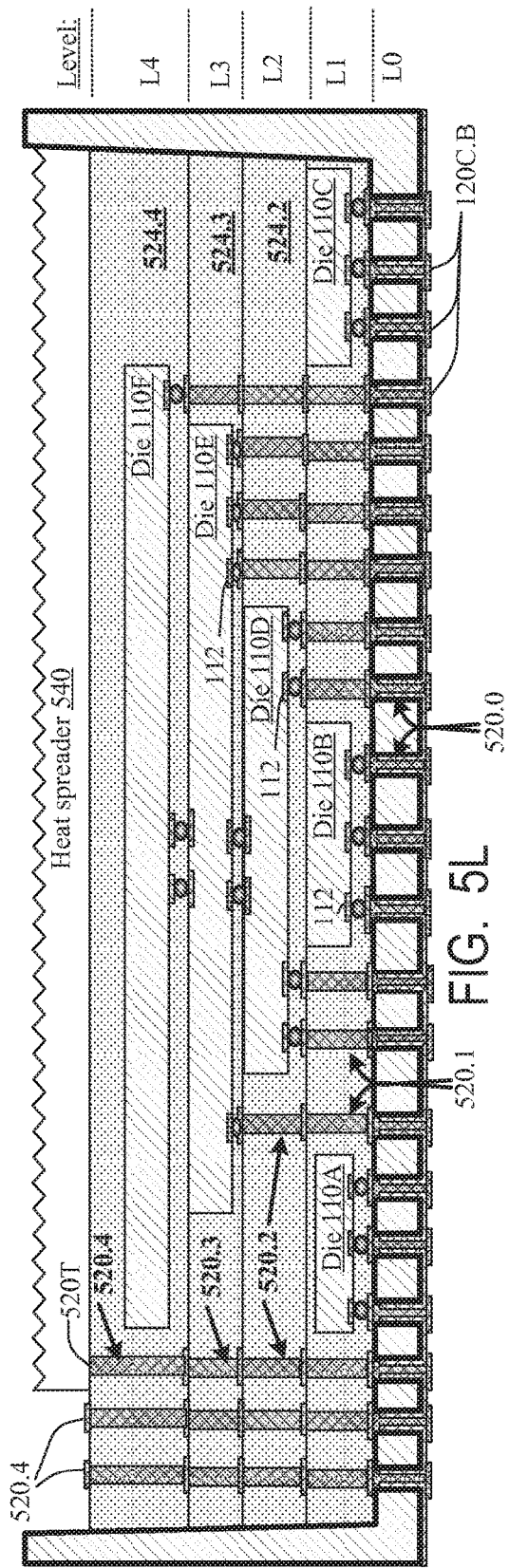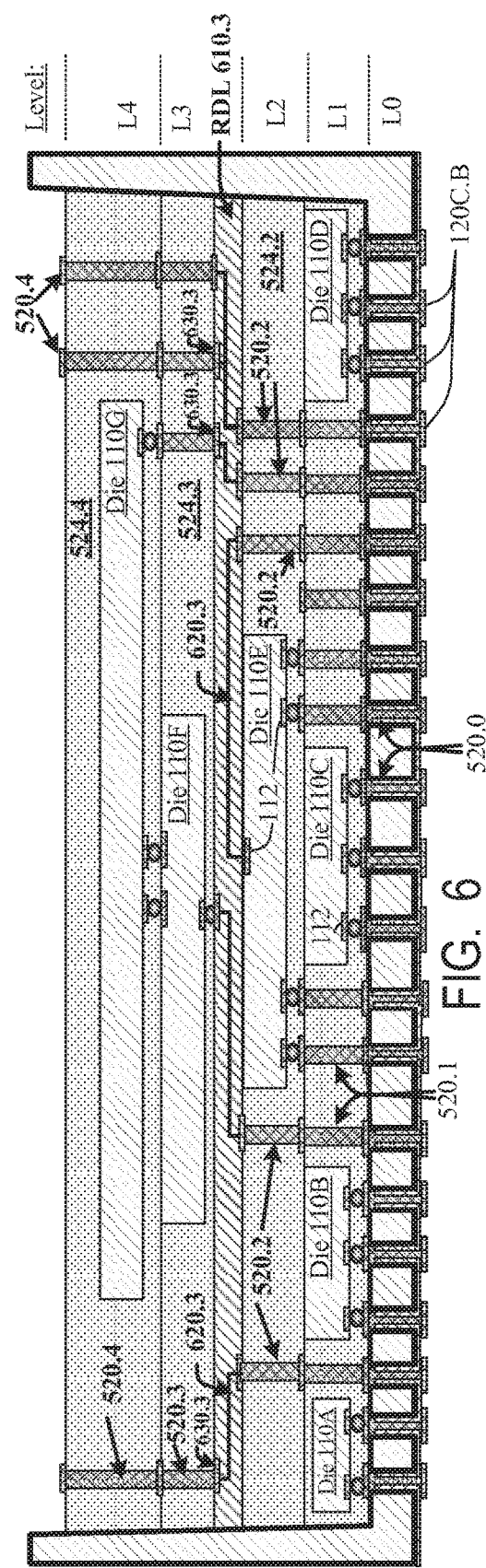

INTERPOSERS WITH CIRCUIT MODULES ENCAPSULATED BY MOLDABLE MATERIAL IN A CAVITY, AND METHODS OF FABRICATION

CROSS REFERENCE TO RELATED APPLICATIONS

The present application is a continuation of U.S. patent application Ser. No. 14/558,462, filed Dec. 2, 2014, incorporated herein by reference, which claims priority of a U.S. provisional patent application No. 61/952,066, filed Mar. 12, 2014, incorporated herein by reference.

BACKGROUND OF THE INVENTION

The present invention relates to semiconductor technology, and more particularly to use of auxiliary substrates for interconnection of semiconductor integrated circuits and other components.

Semiconductor integrated circuits (ICs) are miniature devices with tiny contact pads that must be connected to other IC or non-IC components. The connection to other components is facilitated by auxiliary substrates such as printed circuit boards (PCBs) or interposers. FIG. 1 illustrates ICs 110 connected to a PCB 114 through an interposer 120. ICs 110 have contact pads 112 attached to contact pads 120C.T on top of interposer 120. The attachment is via connections 140 that can be solder, adhesive, or thermocompression for example. The interposer's bottom contact pads 120C.B are attached to the PCB's contact pads 114C (by suitable connections 140). Interconnect lines 120L in interposer 120 provide desired connection between the interposer's contact pads 120C (i.e. 120C.T and 120C.B). The PCB's interconnect lines 114L provide desired connection between the PCB's contact pads 114C. Other interposers, ICs, or other circuits can be connected to the PCB.

To provide small size, high operating speed, low power consumption, and low manufacturing cost, each component 110, 114, 120 may have densely packed circuitry with correspondingly densely packed contact pads 112, 114C, 120C and preferably short interconnect lines ("wires") 114L, 120L. In particular, the interposer 120 should be thin to shorten the vertical segments of lines 120L. Thin interposers can be inexpensively fabricated from organic or ceramic materials. However, a thin interposer can be fragile and flexible and can be easily warped or broken by mechanical stresses, such as thermal stresses arising from thermal expansion. Thermal stresses are particularly damaging in the presence of materials with different coefficients of thermal expansion (CTEs). For example, silicon has a lower CTE than organic or ceramic materials commonly used in PCBs and interposers, and this is a serious problem for using organic or ceramic PCBs and interposers with silicon-based ICs. Thermal stresses can damage the connections 140 and make the assembly inoperable. Also, thermal stresses contribute to warpage which complicates the assembly process.

Therefore, it is desired to stiffen the interposer against warpage and also to use thermally conductive materials that spread locally generated heat and conduct such heat into the ambient.

FIG. 2 illustrates a known ceramic or organic interposer 120 with a cover 210 over a die 110 (a die is an IC that was manufactured as part of a semiconductor wafer and then separated from the wafer; the wafer may contain multiple dies fabricated at the same time). The interposer connects the die 110 to bottom contact pads 120C.B; lines 120L are not shown. Cover 210 is attached to interposer 120 by epoxy 220. Cover 210 stiffens and flattens the interposer, and acts like a heat spreader: the heat generated by die 110 is conducted through thermal grease 230 to cover 210 and then to the ambient. See U.S. Pat. No. 7,061,102 issued Jun. 13, 2006 to Eghan et al.

In order to reduce thermal stresses at the interface between stiffener 210 and interposer 120, the stiffener and the interposer can be made in a single substrate 120S as shown in FIG. 3 and described in the Eghan patent. Substrate 120S has a cavity 304 containing the die 110; the die is surrounded by the substrate's "perimeter wall" 304P. The assembly can be further strengthened by underfill 310 between the die and the interposer: the underfill is made of epoxy that glues the die to the interposer and thus relieves the stress on connections 140. Also, the underfill can be thermally conductive to spread the heat. In addition, thermally conductive encapsulant 320 fills the spaces between the die and the walls 304P to protect the die and help in heat spreading. The encapsulant may or may not cover the die, and an additional heat spreader (not shown) may be provided on top.

FIG. 4 illustrates an organic (molded epoxy or plastic) interposer 120 supporting a stack of three dies 110.1, 110.2, 110.3, as described in U.S. Pat. No. 6,492,726 (Quek et al., Dec. 10, 2002). Here the interposer cavity 304 has stepped sidewalls, with different dies 110.1, 110.2, 110.3 mounted on respective different steps 410.1, 410.2, 410.3 (410.1 is the cavity bottom). For each step, contact structures 420 extend from the respective "contact balls" 140 down through the interposer where they can be accessed from below the interposer. See also U.S. Pat. No. 7,977,579 (Bathan et al., Jul. 12, 2011).

The dies 110 (i.e. 110.1, 110.2, 110.3) of FIG. 4 can be underfilled and encapsulated with suitable dielectric materials (not shown). A heat spreader (not shown) can be provided on top.

SUMMARY

This section summarizes some features of the invention. Other features may be described in the subsequent sections. The invention is defined by the appended claims, which are incorporated into this section by reference.

Some embodiments provide architectures and fabrication techniques suitable for organic, ceramic, silicon, or other types of interposers with cavities. An interposer structure may include multiple levels of dies or multi-chip modules (MCMs). Some embodiments provide simple manufacturing processes.

The invention is not limited to the features and advantages described above except as defined by the appended claims.

BRIEF DESCRIPTION OF THE DRAWINGS

FIGS. 5A, 5B.1 show vertical cross sections of interposers in the process of fabrication according to some embodiments of the present invention.

FIG. 5B.2 is a top view of an interposer in the process of fabrication according to some embodiments of the present invention.

FIGS. 5C, 5D, 5E, 5F, 5G, 5H, 5I, 5J, 5K, 5L, 6, 7, 8A show vertical cross sections of interposers in the process of fabrication according to some embodiments of the present invention.

DESCRIPTION OF SOME EMBODIMENTS

The embodiments described in this section illustrate but do not limit the invention. The invention is defined by the appended claims.

Figure 1:
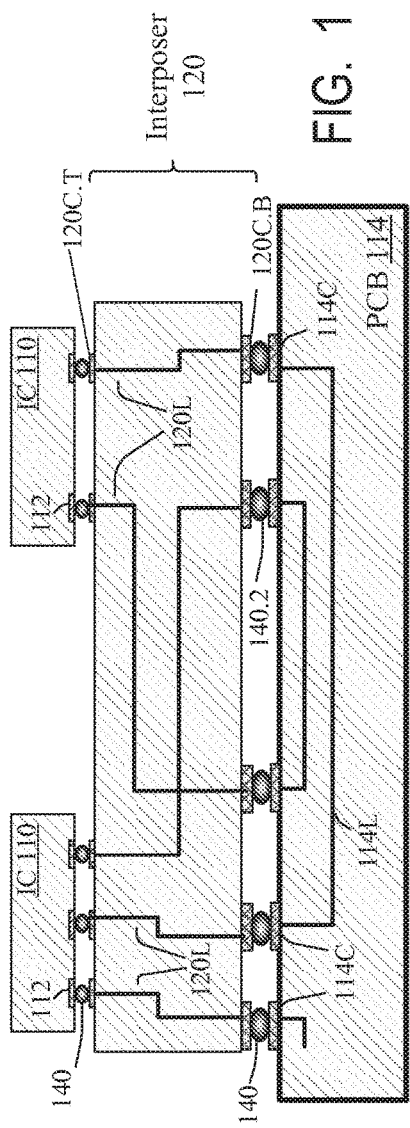
FIGS. 1, 2, 3, 4 show vertical cross sections of structures with interposers according to prior art.
Figure 3:
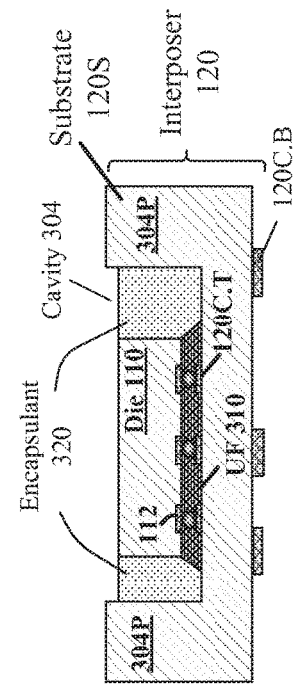
Figure 2:
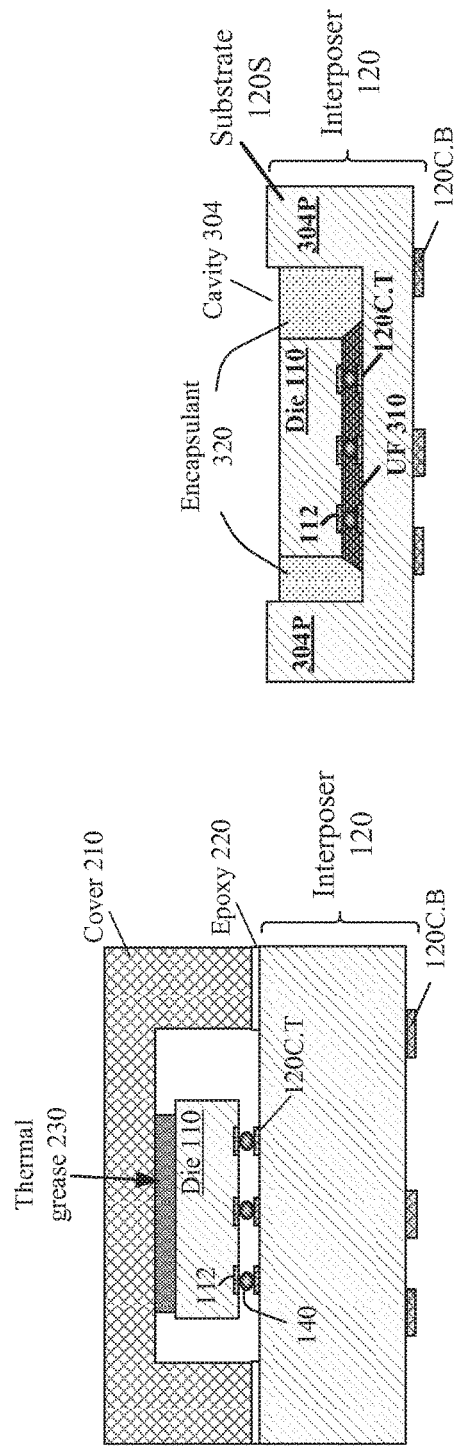
Figure 4:
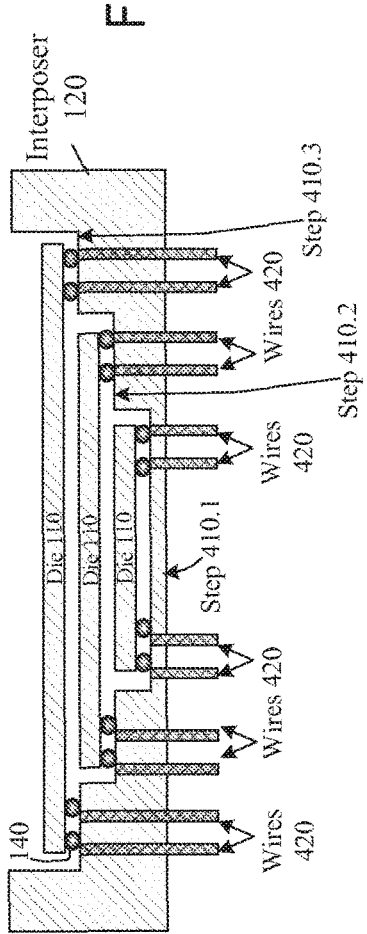

In some embodiments of the present invention, stacked dies or multi-chip modules (MCM) can be placed in an interposer cavity that may have any shape, as in FIGS. 2-4 or other shapes. Some embodiments use vertical wires similar to 420 for connecting upper dies to circuitry below the interposer. However, in some embodiments, the wires go only through a small portion of the interposer thickness. For example, the wires may go through the cavity's bottom wall but not through any portion of the peripheral walls.

In some embodiments, the assembly is manufactured as a stack of levels inside the cavity; each level includes a respective die or dies 110 and encapsulant encircling the dies. A vertical wire may go through multiple encapsulant levels. A wire's segment through each level is made separately by depositing conductive material in a hole made in this level. This short segment is easier to fabricate than depositing conductive material into a deeper hole whose depth is the entire length of the wire. Since the long wires are easier to fabricate, higher stacking is possible, and each wire can be narrower to improve the wire density.

Figure 5A:
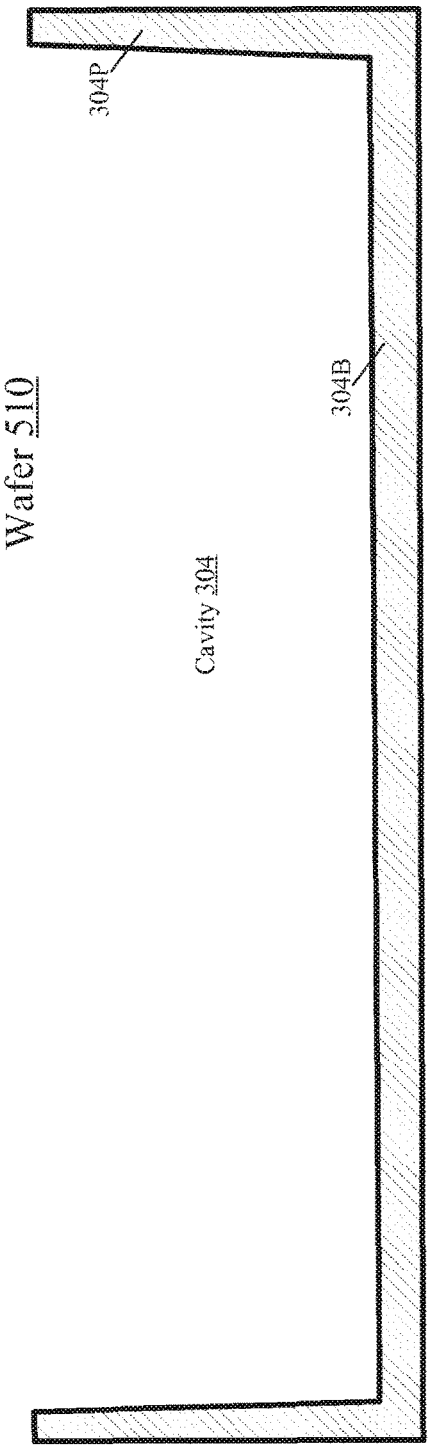

FIG. 5A illustrates the beginning stages of interposer fabrication according to some embodiments of the present invention. As shown in FIG. 5A, the interposer fabrication starts with a substrate 510, e.g. a wafer made of silicon (monocrystalline or some other type) or another semiconductor or non-semiconductor material. We will focus on fabrication techniques suitable for wafers made of silicon, but similar techniques can be used for other semiconductor and non-semiconductor materials including metals, glass, ceramic, polymers, organic or composite materials, and including laminates.

Wafer 510 is sufficiently thick to provide desired stiffness, heat dissipation, and/or other desired properties. For example, some embodiments use a monocrystalline silicon wafer of 200 or 300 mm diameter and at least 650 micron thickness. In some embodiments, the length of vertical wires to be made in the structure need not be taken into account in selecting the wafer thickness because the wire length is not defined by the wafer thickness.

Cavity 304 is formed in the top surface of wafer 510, by a masked etch for example. Multiple etches can be used, with different masks, to provide a stepped sidewall as in FIG. 4 if desired. An exemplary cavity depth is 400 microns or less. The vertical wires will pass through the cavity's bottom wall 304B.

We will refer to the top side of wafer 510 as the "cavity side", and the bottom side as the "anti-cavity side". Also, we will refer to the cavity side as the "top side", and will always show it on top, even though the wafer can be turned upside down or at any angle during fabrication or operation. Likewise, we will call the anti-cavity side the "bottom side".

If multiple interposers are fabricated in the same wafer, then multiple cavities 304 can be formed at the same time. The multiple interposers can be made simultaneously, and the wafer can later be diced to separate the interposers. Only one interposer will be shown for simplicity.

The lateral extent of the cavity is defined by perimeter walls 304P. The walls are sufficiently wide (horizontally) to provide desired stiffness and keep flat the cavity's bottom wall 304B and the entire wafer 510.

Then (FIG. 5B.1) holes 514.0 are made through the cavity's bottom wall 304B to accommodate the bottom segments of the vertical wires. FIG. 5B.2 is the top view of the structure, with an array of holes 514.0. The holes may be in any number, and may have any geometry (circular as in FIG. 5B.2, square, or some other shape).

The holes can be made by a masked etch. The mask can be made on the anti- cavity side, and the etch can be conducted from the anti-cavity side. Alternatively, masking and etching can be done from the cavity side. Non-masking techniques can also be used, e.g. laser ablation or stamping from the cavity or anti-cavity side (stamping is appropriate if the interposer is made of a soft material, such as soft plastic). Other methods can also be used. For moldable materials (e.g. plastics), the structure of FIGS. 5B.1 and 5B.2 can be made by molding without any etches or masks.

Holes 514.0 will contain conductive through-substrate vias (TSVs) for the vertical wires. Conventional formation of high density TSVs is a challenging process because on the one hand, the TSVs should be narrow for high density, and on the other hand the substrate has to be thick to provide mechanical strength. Making narrow TSVs through a thick substrate is difficult. However, the wafer of FIGS. 5B.1, 5B.2 is strengthened by peripheral walls 304P, and the TSVs pass only through the bottom wall 304B. If the bottom wall 304B is thin, the TSVs can be narrow and therefore can be at higher density. The bottom wall's thickness is 20 microns or less in some silicon embodiments.

If desired, circuitry (not shown) is formed in wafer 510, possibly including transistors, diodes, capacitors, and/or other circuit elements. The circuitry can be formed in the walls 304P and/or 304B before formation of cavities 304 and/or at any other fabrication stages.

We will refer to holes 514.0 as "level-zero holes" or "level L0 holes". Other holes will be made at higher levels as described below. (We use the concept of levels for ease of description; the invention pertains to structures and methods and not to any description techniques.)

Figure 5C:
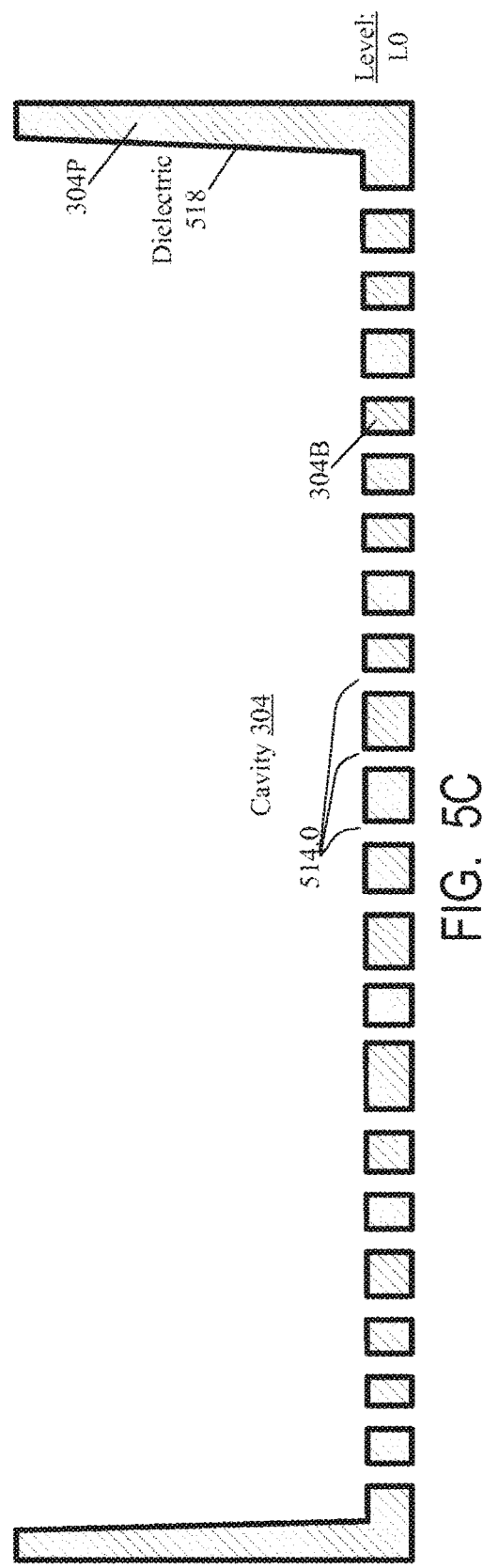
Figure 5H:
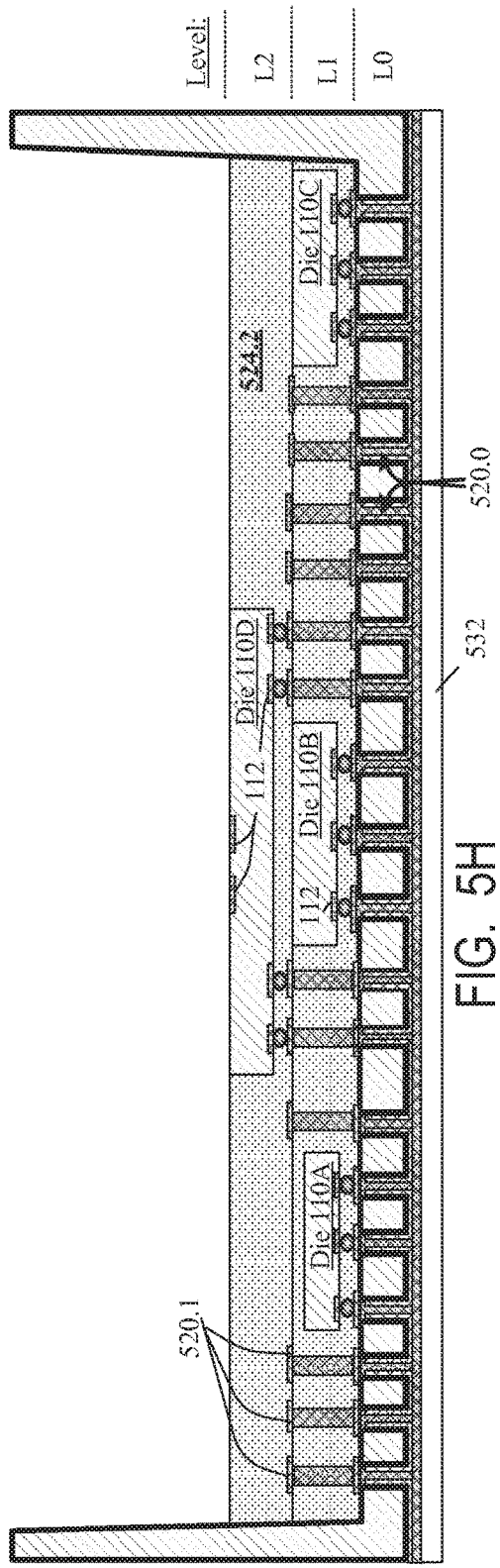
Figure 5I:
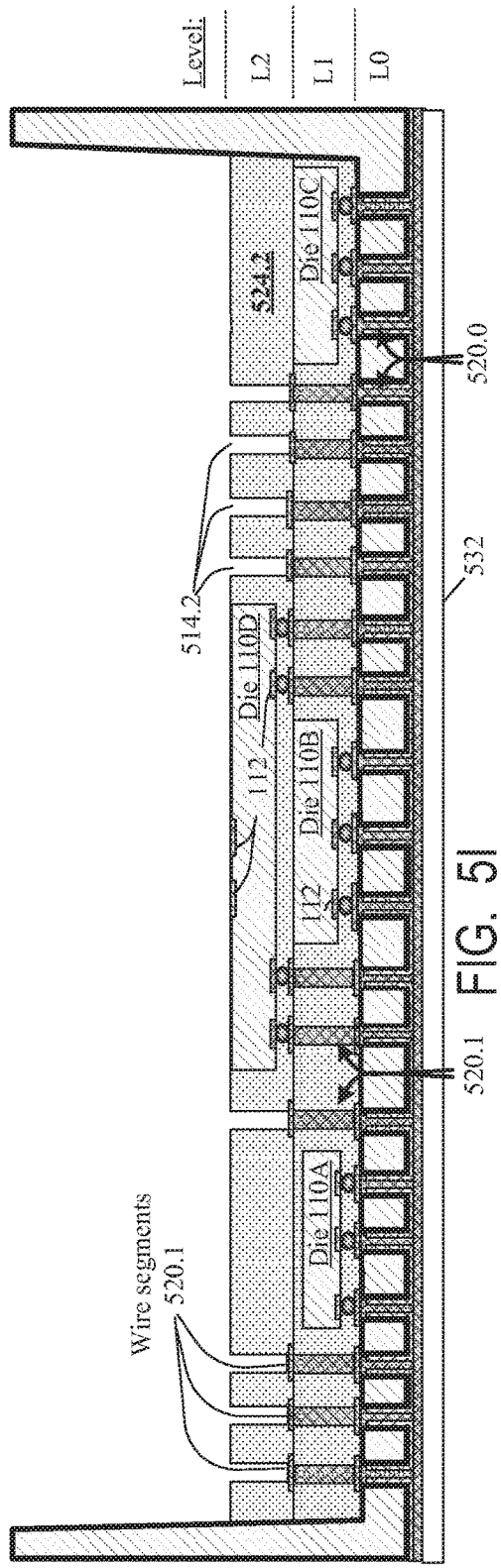

If wafer 510 is made of a non-dielectric material (e.g. silicon), dielectric 518 (FIG. 5C) can be formed on the holes' sidewalls. The dielectric may cover all the wafer as in FIG. 5C, or may cover just the holes' surfaces and possibly additional areas as needed. If the dielectric covers the whole wafer, no masking is needed. If the dielectric covers only the hole surfaces, the dielectric can be formed using the same mask (not shown) that was used to form the holes 514.0 (the dielectric can be patterned by a lift-off process for example).

The dielectric can be formed by sputtering (this is appropriate for silicon dioxide, silicon nitride, and some other dielectric materials), or thermal oxidation (if the wafer is made of silicon or some other oxidizable material whose oxide is dielectric), or by some other process. The above processes and dielectric materials are not limiting.

If desired, a barrier layer (not shown) can be formed over the dielectric 518 in the holes and elsewhere, to protect the wafer from contamination by subsequently formed materials, e.g. metals.

As shown in FIG. 5D, holes 514.0 are filled (or lined) with conductive material 520.0 to form TSVs that will serve as wire segments. This can be done by sputtering or other techniques, e.g. electroplating (which is relatively inexpensive). In the example of FIG. 5D, the electroplating uses a seed layer 520S formed to cover the anti-cavity side. The seed layer may or may not enter the holes 514.0. In an exemplary embodiment, the seed layer is copper formed by sputtering. To prevent copper formation on the top (cavity) side, the sputtering can be performed at an angle, i.e. the wafer can be inclined to prevent the copper molecules from reaching the cavity through the holes. Alternatively, the seed layer can be foil (e.g. copper foil) laminated on the anti-cavity side. Other techniques can also be used.

Then the structure is placed in a plating bath (not shown), and the seed layer 520S is connected to a terminal 534 of an electric power source to serve as a cathode in the plating operation. As a result, the holes 514.0 are plated with conductor 520.0, e.g. copper. Conductor 520.0 fills the holes 514.0, and thus provides contact pads at the cavity bottom, i.e. at the top surface of bottom wall 304B. The contact pads may be wider than the holes 514.0.

Conductor 520.0 may include multiple layers made in different electroplating and/or electroless-plating steps.

As shown in FIG. 5D, if seed 510S is not masked from the bottom, the conductor can also be plated on the bottom of the seed layer. The conductor plated on the seed layer's bottom is marked as 520' in FIG. 5D, but is not marked separately in subsequent drawings. Rather, to simplify the drawings, we use numeral 520S both for the seed layer and the conductor 520', and we refer to both layers as "seed layer 520S".

Conductor 520.0, 520S may include multiple conductive layers. In some embodiments, the conductor top surfaces (inside the cavities) are usable as seed for electroplating of other wire segments as described below.

An optional protective layer 532 (FIG. 5E), e.g. polyimide or some other organic polymer, can be deposited on the bottom surface of layer 520' to protect the structure and avoid electroplating on the bottom surface in subsequent plating steps.

One or more dies 110 are placed into the cavity onto bottom wall 304B. Three dies 110A, 110B, 110C are shown, and any number can be present. The dies' contact pads 112 are attached to respective contact pads 520.0 (by connections such as 140 described above, e.g. solder, adhesive, thermocompression, or possibly other types (possibly discrete wires); different connections can be used for different dies in the same structure). We will refer to these dies as level-one dies or level L1 dies or L1 dies.

The dies are underfilled and encapsulated by a suitable dielectric encapsulant 524.1 (level-one or L1 "encapsulant" below). Underfilling can be done by capillary or no-flow techniques. Encapsulation can be done by spin-on deposition and curing of moldable material or possibly by other techniques. Suitable underfill and encapsulant materials can be conventional, including organic polymer resins—such as BCB (benzocyclobutene) or epoxy—with suitable fillers, or possibly other types. We will refer to the underfill and encapsulant as "encapsulant 524.1".

In FIG. 5E, encapsulant 524.1 reaches as high as the top surfaces of dies 510B and 510C, thus encapsulating these dies laterally and below, but the encapsulant does not cover these dies. The encapsulant covers the die 110A. The encapsulant can reach any level, and in particular can cover more than one dies, and/or on the contrary can terminate below the top surfaces of one or more of the dies. The top surface level can be adjusted by lowering the encapsulant level after deposition, e.g. using chemical etching or etching by abrasives (e.g. dry or wet blasting).

Some of contact pads 520.0 are not covered by any L1 die 110.

Holes 514.1 (FIG. 5F) are formed in the encapsulant to expose contact pads 520.0 not covered by L1 dies 110. We will refer to holes 514.1 as level-1 or L1 holes. A suitable process for making L1 holes 514.1 depends on the encapsulant's material. For example, for resins, laser ablation can be used, which is a known technique in fabrication of through-mold vias (TMVs). If the encapsulant is photoimageable, then photolithographic techniques can be used, i.e. exposure to light through a glass-based mask followed by development in a developer solution. These examples are not limiting.

L1 holes 514.1 expose contact pads 520.0. The holes are filled or lined with conductor 520.1 (FIG. 5G) to form level-L1 wire segments. Segments 520.1 can be formed by electroplating: the plating current can be provided from the anti-cavity side through seed layer 520S and L0 wire segments 520.0, by connecting the seed layer to an electric power source's terminal 534. Conductor 520.1 fills (or lines) L1 holes 514.1, and thus provides contact pads ("L1 contact pads") at the top surface of L1 encapsulant 524.1. The L1 contact pads may be wider than the L1 holes 514.1.

This process can be continued any number of times, to build any number of levels. For example, FIGS. 5H-5L illustrate level L2 formation. One or more dies 110 ("L2 dies"), including the die 110D, are attached on top of level L1; the dies' contact pads are attached to L1 contact pads 520.1. In this embodiment, die 110D has contact pads 112 both on top and bottom. The top contact pads 112 will be attached to overlying circuitry (not yet formed).

L2 encapsulant 524.2 is formed to underfill and encapsulate the L2 dies. L2 holes 514.2 (FIG. 5I) are formed in L2 encapsulant 524.2 to expose those L1 contact pads 520.1 that are not covered by a die. L2 holes 514.2 are filled or lined with conductor 520.2 (FIG. 5J) which provides L2 wire segments. Conductor 520.2 can be formed by electroplating; the plating current can be provided from the bottom side through seed layer 520S and lower-level wire segments 520.0, 520.1 by connecting the seed layer 520S to a terminal 534 of an electric power source. The L2 wire segments 520.2 contact the underlying L1 wire segments 520.1 and provide contact pads at the top of L2 encapsulant 524.2. The contact pads can be wider than the L2 holes 514.2. The L2 features can be formed using the same processes as described above for level L1.

FIG. 5K shows a final structure with four levels and a heat spreader 540 on top. Level L3 includes a die 110E some of whose bottom contact pads are attached to the level L2 contact pads 520.2 (not marked in this figure). Other bottom contact pads of die 110E are attached to top contact pads 112 of L2 die 110D. L3 die 110E is underfilled and laterally encapsulated by encapsulant 524.3 made of moldable material. L3 wire segments 520.3 are vertical segments passing through encapsulant 524.3. L4 die 110F has bottom contact pads attached to top contact pads of L3 die 110E and to the wire segments 520.3 (to the top contact pads provided by these segments). L3 wire segments 520.3 can be formed by electroplating; the plating current can be provided from the bottom side through lower-level wire segments 520.0, 520.1, 520.2. L4 die 110F is underfilled and laterally encapsulated by encapsulant 524.4 made of moldable material. L4 wire segments 520.4 are vertical segments passing through encapsulant 524.4. External circuits (not shown), e.g. dies, MCMs, or discrete wires or other discrete components, can be attached to the top ends of segments 520.4. The top ends can be formed to facilitate such attachment; for example, if the attachment will be by solder, then a barrier layer such as nickel can be electroplated or electroless-plated to protect underlying portions of segments 520.4 from solder contamination; and gold can be electroplated or electroless-plated on top of segments 520.4 to block oxidation during soldering.

The structure of FIG. 5K includes a vertical wire 520T having no electrical functionality but provided for heat removal. This wire consists of vertical segments 520 of levels 0 through 4 (i.e. 520.0, 520.1, 520.2, 520.3, 520.4). This wire reaches heat spreader 540. The top level segments 520.4 can be formed by electroplating; the plating current can be provided from the bottom side through lower-level wire segments 520.0, 520.1, 520.2, 520.3. Any number of heat-removal wires can be provided; the heat-removal wires may or may not reach the heat spreader.

The top level L4 includes wire segments 520.4 that provide contact pads at the top of encapsulant 520.4 side-by-side with heat spreader 540. These contact pads can be connected to external circuits as mentioned above.

In some embodiments, each encapsulant layer 524 is deposited and cured in a separate operation; the encapsulant layer does not have any separately-cured sub-layers. Therefore, the encapsulant layer does not have any internal surface boundaries that would be present between sub-layers. An internal surface boundary is characterized by surface states. A surface state is a state with molecules having higher energies than below the surface; surface states may be detectable visually (possibly using microscopy) or perhaps by ultrasound or other ways. The invention is not limited to such embodiments however.

In some embodiments, if a die or dies 110 of a level Li are underfilled in a separate operation than lateral encapsulation, and the underfill is separately cured, then the encapsulant layer may have a surface at the boundary between the underfill and laterally encapsulating portion of the encapsulant. Further, the laterally encapsulating portion can be made of a different material than the underfill.

After or at any point during fabrication of all the levels, the interposer's bottom can be processed to remove or pattern protective layer 532 and conductor 520S in any desired manner. In FIG. 5L, layer 532 is removed, and the conductor is thinned and patterned to provide contact pads 120C.B at the ends of wire segments 520.0. These contact pads can be attached to other dies, MCMs, or packaging substrates such as PCBs or interposers. Alternatively, other circuitry can be formed on the bottom, e.g. as part of a redistribution layer (RDL) including multiple dielectric, conductive, and semiconductor layers that provide circuitry coupled to wire segments 520.0 and accessible from below the interposer. The redistribution layer may have contact pads at the bottom that can be coupled to other dies, MCMs, or packaging substrates such as PCBs or interposers.

FIG. 6 shows additional features that may be available in some embodiments. Here level L3 includes a redistribution layer 610.3 which may have a number of conductive layers separated by dielectric layers. The conductive layers provide interconnects 620.3 which extend both vertically and laterally (possibly horizontally). Interconnects 620.3 terminate in contact pads 630.3 at the top of the RDL. Interconnects 620.3 interconnect the underlying wire segments 520.2 and the overlying wire segments 520.3 as desired. In some embodiments, the dielectric layers of RDL 610.3 are formed of the same or similar materials as encapsulant layers 524 (e.g. moldable organic polymer deposited by a spin-on process, or from other materials described above), and are patterned by the same techniques (e.g. photolithography or laser ablation). The conductive layers can also be formed by other deposition and patterning techniques, e.g. using photolithography or by additive manufacturing (printing).

In the example of FIG. 6, some RDL lines 620.3 connect L2 wire segments 520.2 to L3 wire segments 520.3. A line 620.3 connects a top contact pad 112 of L2 die 110E to the top of an L2 wire segment 520.2. Another line 620.3 connects an L2 wire segment 520.2 to a bottom contact pad of L3 die 110F.

Contact pads 630.3 at the ends of lines 620.3 can provide an area array pattern or other patterns as needed for connection to L3 dies and wire segments.

Figure 7:
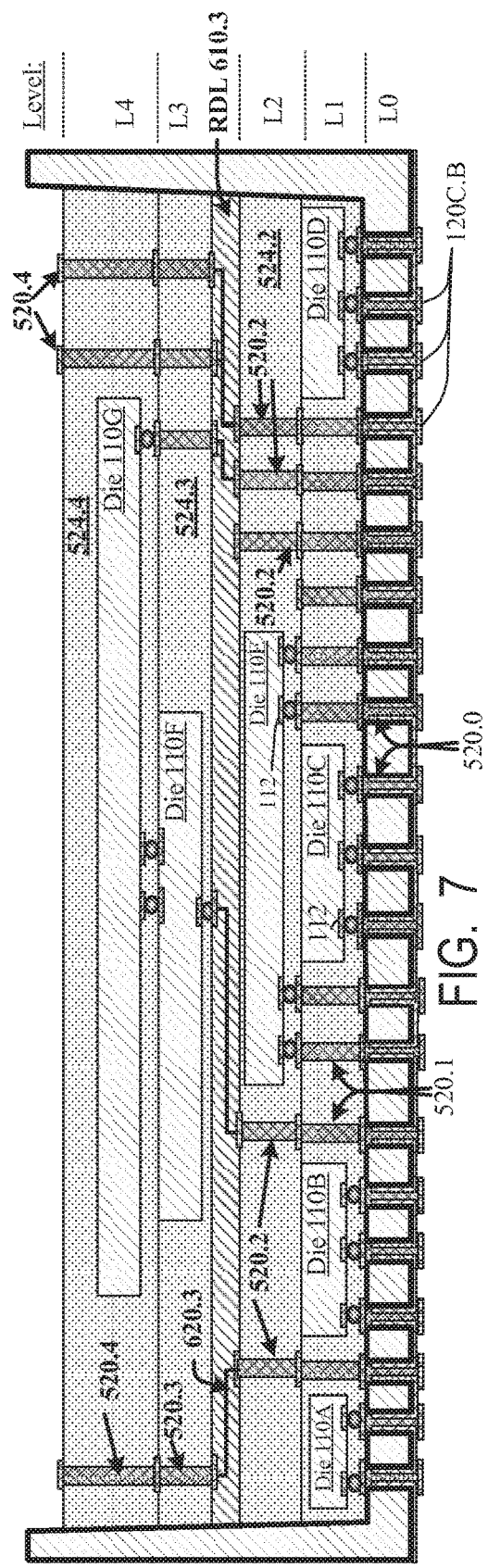

In some embodiments, level L2 includes a die that has no bottom contact pads, but has only top contact pads connected to other circuitry by RDL 610.3. Any level may include a die having no bottom contact pads and having top contact pads attached to other circuits within or outside the cavity. Also a die may have no top contact pads. In the example of FIG. 7, die 110E has no top contact pads, and further L2 encapsulant 524.2 covers the die, and RDL 610.3 covers the encapsulant.

Level L3 wire segments 520.3 (FIGS. 6, 7) can be formed at the top of RDL 610.3 by electroplating; the plating current is conducted from the bottom layer 520S to the top of RDL 610.3 through wire segments 620.3.

L4 wire segments 520.4 and their respective underlying L3 segments 520.3 are for heat removal.

Above, RDL 610.3 is associated with level L3, but this is simply a matter of terminology: we could say that RDL 610.3 is part of level L2. An RDL can be provided at any level. Also, multiple alternating RDLs and encapsulant layers can be provided in a single level, i.e. for a single set of dies 110 attached to the preceding level.

Figure 8A:
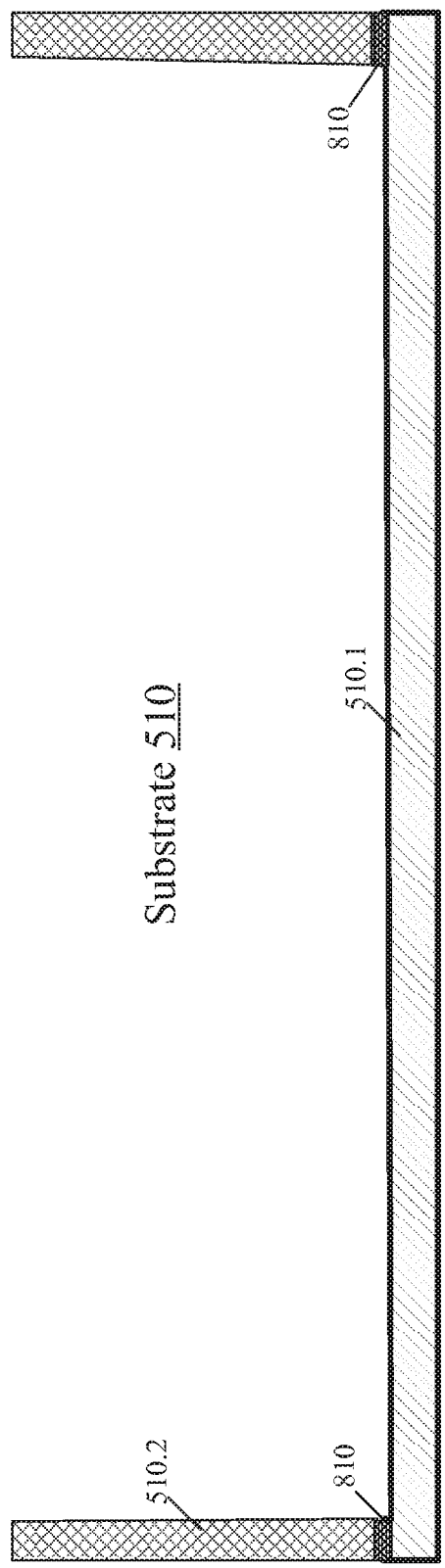
Figure 8B:
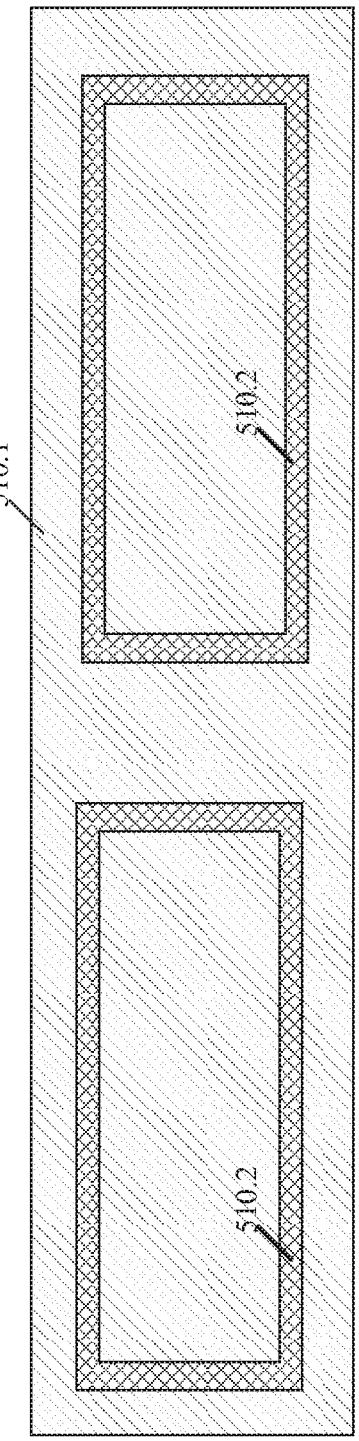
FIG. 8B is a top view of an interposer in the process of fabrication according to some embodiments of the present invention.

Substrate 510 can be assembled from different substrates, and an example is shown in FIGS. 8A (vertical cross section) and 8B (top view on a smaller scale than FIG. 8A). In this example, substrate 510 includes a planar substrates 510.1 and a substrate 510.2 attached to planar substrate 510.1. The attachment is by adhesive 810, but direct bonding can also be used. In FIG. 8B, multiple substrates 510.2 (called "frames" below) are attached to a single planar substrate 510.1, and multiple structures are formed of the type of FIG. 7 or other types discussed above on the same planar substrate 510.1. The planar substrate 510.1 can be diced along lines (not shown) passing between the frames 510.2 at the end of fabrication or at any other fabrication stage.

Planar substrate 510.1 and frames 510.2 can be made of the same or different materials, including any materials mentioned above for wafer 510. Adhesive 810, if present, can be any suitable adhesive, e.g. plastic deposited in a flowable form and then cured using heat, pressure, radiation, and/or other means. Non-flowable adhesives can also be used. Substrate 510 may include a stack of more than two substrates, e.g. each frame 510.2 or planar substrate 510.1 may be a laminate of multiple substrates.

Regardless of whether or not the substrate 510 is an assembly of multiple substrates, substrate 510 (and each constituent substrate if present) may be a uniform or non-uniform medium, i.e. may or may not have the same physical properties at each internal point. In some embodiments, substrate 510 is uniform with respect to any one or more of the following properties: chemical composition, density, elasticity modulus, conductivity, dielectric constant, ultrasound (US) propagation speed for one or more wavelengths (possibly all US wavelengths), light propagation speed for one or more wavelengths (e.g. wavelengths in the infrared range and below). For example, uniform substrate 510 can be a single crystal (e.g. monocrystalline silicon), and can be organic or inorganic, and can be a composite material or other materials described above. These examples are not limiting. If the substrate 510 is an assembly of multiple pieces such as 510.1 and 510.2, then in some embodiments an interface region of the adjacent pieces (the region including adjacent parts of the two pieces) is not uniform with respect to at least one of the properties mentioned above, i.e. chemical composition, density, elasticity modulus, conductivity, dielectric constant, ultrasound propagation speed for one or more wavelengths, light propagation speed for one or more wavelengths. For example, in FIG. 7A, the interface region can be defined as including adhesive 810 and adjacent surfaces of substrates 510.1 and 510.2, and the interface is not uniform if the adhesive has a different chemical composition than the adjacent surfaces of substrate 510.1 or 510.2. If the attachment is by direct bonding of substrate 510.1 to 510.2 and the substrates are made of the same material (e.g. silicon), the interface can be uniform, and the substrate 510 can be indistinguishable from a substrate made initially from a single piece. However, the interface can also be non-uniform with respect to light or sound propagation speed, e.g. if the interface includes bubbles or other states detectable by US or spectral imaging.

The invention is not limited to the embodiments described above. Other embodiments and variations are within the scope of the invention, as defined by the appended claims.

The invention claimed is:

1. An assembly comprising:
a substrate whose top side comprises a cavity comprising a bottom wall;
one or more contact pads under the bottom wall;
a plurality of levels overlying one another in the cavity, each level comprising one or more dies laterally encapsulated by an encapsulant layer made of cured resin at least partially cured separately from the encapsulant layer of any other level; and
electrically conductive wiring passing through a plurality of the encapsulant layers and through the bottom wall to connect one or more of the dies to the one or more contact pads under the bottom wall, the electrically conductive wiring connecting at least one die overlying more than one of the encapsulant layers to at least one contact pad under the bottom wall.

2. The assembly of claim 1 wherein the one or more contact pads under the bottom wall are part of a redistribution layer formed on a bottom surface of the substrate.

3. The assembly of claim 1 wherein the electrically conductive wiring comprises a plurality of vertical segments each of which passes through a respective one of the encapsulant layers and is electrically connected, by the electrically conductive wiring, to the at least one die and to the at least one contact pad.

4. The assembly of claim 3 wherein the electrically conductive wiring comprises, at a top of each vertical segment, a contact pad physically contacting the vertical segment and the encapsulant layer through which the vertical segment passes, the contact pad being wider than the vertical segment.

5. The assembly of claim 3 wherein the electrically conductive wiring comprises, at a bottom of each vertical segment, a contact pad physically contacting the vertical segment and the encapsulant layer through which the vertical segment passes, the contact pad being wider than the vertical segment.

6. The assembly of claim 3 wherein the electrically conductive wiring comprises a conductive path comprising a non-vertical line and interconnecting two of the vertical segments passing through the respective encapsulant layers adjacent to each other.

7. The assembly of claim 1 wherein each encapsulant layer does not have any separately cured sub-layers.

8. The assembly of claim 1, comprising one or more contact pads on top of the plurality of levels, for connection to structures external to the assembly.

9. The assembly of claim 1 wherein in least one level, at least one die is part of a multi-chip module contained by the level.

10. The assembly of claim 1 wherein each level comprises at least one die whose top surface is coplanar with the encapsulant layer of the level.

11. An assembly comprising:
a substrate whose top side comprises a cavity comprising a bottom wall;
one or more contact pads under the bottom wall;
a plurality of levels overlying one another in the cavity, each level comprising one or more dies laterally encapsulated by an encapsulant layer comprising organic polymer; and
electrically conductive wiring passing through a plurality of the encapsulant layers and through the bottom wall to connect one or more of the dies to the one or more contact pads under the bottom wall, the electrically conductive wiring connecting at least one die overlying more than one of the encapsulant layers to at least one contact pad under the bottom wall;
wherein the electrically conductive wiring comprises a plurality of vertical segments each of which passes through a respective one of the encapsulant layers and is electrically connected, by the electrically conductive wiring, to the at least one die and to the at least one contact pad; and
wherein the electrically conductive wiring comprises, at a top of each vertical segment, a contact pad physically contacting the vertical segment and the encapsulant layer through which the vertical segment passes, the contact pad being wider than the vertical segment.

12. The assembly of claim 11 wherein the electrically conductive wiring comprises, at a bottom of each vertical segment, a contact pad physically contacting the vertical segment and the encapsulant layer through which the vertical segment passes, the contact pad being wider than the vertical segment.

13. The assembly of claim 11 wherein the electrically conductive wiring comprises a conductive path comprising a non-vertical line and interconnecting two of the vertical segments passing through the respective encapsulant layers adjacent to each other.

14. The assembly of claim 11 wherein the one or more contact pads under the bottom wall are part of a redistribution layer formed on a bottom surface of the substrate.

15. The assembly of claim 11, comprising one or more contact pads on top of the plurality of levels, for connection to structures external to the assembly.

16. The assembly of claim 11 wherein in least one level, at least one die is part of a multi-chip module contained by the level.

17. The assembly of claim 11 wherein each level comprises at least one die whose top surface is coplanar with the encapsulant layer of the level.

18. An assembly comprising:
a substrate whose top side comprises a cavity comprising a bottom wall;
one or more contact pads under the bottom wall;
a plurality of levels overlying one another in the cavity, each level comprising one or more dies laterally encapsulated by an encapsulant layer comprising organic polymer; and electrically conductive wiring passing through a plurality of the encapsulant layers and through the bottom wall to connect one or more of the dies to the one or more contact pads under the bottom wall, the electrically conductive wiring connecting at least one die overlying more than one of the encapsulant layers to at least one contact pad under the bottom wall;

wherein the electrically conductive wiring comprises a plurality of vertical segments each of which passes through a respective one of the encapsulant layers and is electrically connected, by the electrically conductive wiring, to the at least one die and to the at least one contact pad; and wherein the electrically conductive wiring comprises, at a bottom of each vertical segment, a contact pad physically contacting the vertical segment and the encapsulant layer through which the vertical segment passes, the contact pad being wider than the vertical segment.

19. The assembly of claim 18 wherein the electrically conductive wiring comprises a conductive path comprising a non-vertical line and interconnecting two of the vertical segments passing through the respective encapsulant layers adjacent to each other.

20. The assembly of claim 18 wherein each level comprises at least one die whose top surface is coplanar with the encapsulant layer of the level.

* * * * *